(12) United States Patent
Zaidi

(10) Patent No.: US 6,835,246 B2
(45) Date of Patent: Dec. 28, 2004

(54) NANOSTRUCTURES FOR HETERO-EXPITAXIAL GROWTH ON SILICON SUBSTRATES

(76) Inventor: Saleem H. Zaidi, 9813 Fostoria Rd. NE., Albuquerque, NM (US) 87107

( * ) Notice: Subject to any disclaimer, the term of this patent is extended or adjusted under 35 U.S.C. 154(b) by 171 days.

(21) Appl. No.: 10/299,568

(22) Filed: Nov. 18, 2002

(65) Prior Publication Data

US 2003/0168002 A1 Sep. 11, 2003

Related U.S. Application Data

(60) Provisional application No. 60/332,677, filed on Nov. 16, 2001.

(51) Int. Cl.[7] .............................................. C30B 25/04
(52) U.S. Cl. ............................ 117/97; 117/94; 117/95; 117/90; 117/106; 428/642; 428/640; 428/620
(58) Field of Search ............................... 117/94, 95, 90, 117/106, 97; 428/641, 642, 620

(56) References Cited

U.S. PATENT DOCUMENTS

| | | | | |
|---|---|---|---|---|
| 4,914,053 A | * | 4/1990 | Matyi et al. | 438/489 |
| 5,079,616 A | * | 1/1992 | Yacobi et al. | 257/623 |
| 5,084,409 A | * | 1/1992 | Beam et al. | 438/429 |
| 5,341,000 A | * | 8/1994 | Nii | 257/77 |
| 6,603,559 B2 | * | 8/2003 | Tsao et al. | 356/479 |
| 6,623,991 B2 | * | 9/2003 | Johnson et al. | 438/7 |

OTHER PUBLICATIONS

Wada, O., Crow, J., "Chapter 12: Current Status of Optoelectronic Integrated Circuits," *Integrated Optoelectronics*, edited by Dagenais, M., Leheny, R., Crow, J., Academic Press, San Diego, 1995, pp. 447–488.

Messenger, S.R., Xapsos, M.A., Walters, R.J., Cotal, H.L., Wojtczuk, S.J., Serreze, H.B., Summers, G.P., "Spectral Response of InP/Si Solar Cells Irradiated to High Proton Fluences," 26th IEEE PVSC, Sep. 30–Oct. 3, 1997, Anaheim, CA, pp. 995–998.

Jain, S.C., "Germanium–Silicon Strained Layers and Heterostructures," *Advances in Electronics and Electron Physics*, Supplement 24, Academic Press, New York, 1994.

Currie, M.T., Samavedam, S.B., Langdo, T.A., Leitz, C.W., Fitzgerald, E.A., "Controlling Threading Dislocation Densities in Ge on Si Using Graded SiGe Layers and Chemical–Mechanical Polishing," *Applied Physics Letters*, vol. 72.14, American Institute of Physics, Apr. 6, 1998, pp. 1718–1720.

Yacobi, B.G., Zemon, S., Norris, P., Jagannath, C., "Stress Variations Due to Microcracks in GaA Grown on Si," *Appl. Phys. lett.*, vol. 51.26, American Institute of Physics, Dec. 28, 1987, pp. 2236–2238.

Sakai, S., "New Method to Relax Thermal Stress in GaAs Grown on Si Substrates," *Appl. Phys. Lett.*, 51.14, American Institute of Physics, Oct. 5, 1987, pp. 1069–1071.

(List continued on next page.)

*Primary Examiner*—Robert Kunemund
(74) *Attorney, Agent, or Firm*—Samuel M. Freund; Cochran Freund & Young LLC

(57) ABSTRACT

Selected micro- and nanoscale, 1-dimensional and 2-dimensional periodic and random structures generated on silicon and other substrates are expected to perform as compliant, thin films for gettering defects and for accommodating lattice and thermal expansion mismatches during heteroepitaxial growth thereon, thereby leading to relatively defect-free, heteroepitaxial films of chosen thicknesses. The as-grown epilayers or completed electronic and optoelectronic devices can be bonded to a second substrate such as glass, or plastic following separation thereof from the substrate on which they were formed using preferential etching of a readily detachable, nanoporous silicon or silicon dioxide layer introduced between the generated structures and the substrate.

53 Claims, 21 Drawing Sheets

OTHER PUBLICATIONS

Sieg, R.M., Carlin, J.A., Boeckl, J.J., Ringel, S.A., Currie, M.T., Ting, S.M., Langdo, T.A., Taraschi, G., Fitzgerald, E.A., Keyes, B.M., "High Minority–Carrier Lifetimes in GaAs Grown on Low–Defect–Density Ge/GeSi/Si Substrates," *Applied Physics Letters*, vol. 73.21, American Institute of Physics, Nov. 23, 1998, pp. 3111–3113.

Sieg, R.M., Ringel, S.A., Ting, S.M., Samavedam, S.B., Currie, M., Langdo, T., Fitzgerald, E.A., "Toward Device–Quality GaAs Growth by Molecular Beam Epitaxy on Offcut Ge/Si$_{1-x}$Ge$_x$/Si Substrates," *J. Vac. Sci. Technol. B*, vol. 16.3, American Vacuum Society, May/Jun. 1998, pp. 1471–1474.

Paul, D.J., "Silicon–Germanium Strained Layer Materials in Microelectronics," *Advanced Materials*, vol. 11.3, Wiley–VCH, 1999, pp. 191–204.

Li, J.H., Holy, V., Bauer, G., Schaffler, F., "Strain Relaxation in High Electron Mobility Si$_{1-x}$Ge$_x$/Si Structures," *J. Appl. Phys.*, vol. 82.6, American Institute of Physics, Sep. 15, 1997, pp. 2881–2886.

Lutz, M.A., Feenstra, R.M., LeGoues, F.K., Mooney, P.M., Chu, J.O., "Influence of Misfit Dislocations on the Surface Morphology of Si$_{1-x}$Ge$_x$ Films," *Appl. Phys. Lett.*, vol. 66.6, American Institute of Physics, Feb. 6, 1995, pp. 724–726.

Samavedam, S.B., Fitzgerald, E.A., "Novel Dislocation Structure and Surface Morphology Effects in Relaxed Ge/Si–Ge(graded)/Si Structures," *J. Appl. Phys.*, vol. 81.7, American Institute of Physics, Apr. 1, 1997, pp. 3108–3116.

Freundlich, A., Grenet, J.C., Neu, G., Stobl, G., "Stress–Free GaAs Grown on Si Using a Stress Balance Approach," *Appl. Phys. Lett.*, vol. 59.27, American Institute of Physics, Dec. 30, 1991, pp. 3568–3570.

De Boeck, J., Van Hoof, C., Deneffe, K., Mertens, R.P., Borghs, G., "Relief of Thermal Stress in Heteroepitaxial GaAs on Si by Mesa Release and Deposition," *Appl. Phys. Lett.*, vol. 59.10, American Institute of Physics, Sep. 2, 1991, pp. 1179–1181.

Soga, T., Hattori, S., Sakal, S., Umeno, M., "Epitaxial Growth and Material Properties of GaAs on Si Grown by MOCVD," *Journal of Crystal Growth*, vol. 77, Elsevier Science Publishers B.V., North–Holland, Amsterdam, 1986, pp. 498–502.

Matthews, J.W., Mader, S., Light, T.B., "Accommodation of Misfit Across the Interface Between Crystals of Semiconducting Elements or Compounds," *Journal of Applied Physics*, vol. 41.9, Aug. 1970, pp. 3800–3804.

Fitzgerald, E.A., Kirchner, P.D., Proano, R., Pettit, G.D., Woodall, J.M., Ast, D.G., "Elimination of Interface Defects in Mismatched Epilayers by a Reduction in Growth Area," *Appl. Phys. Lett.*, vol. 52.18, American Institute of Physics, May 2, 1988, pp. 1496–1498.

Yamaguchi, M., Tachikawa, M., Sugo, M., Kondo, S., Itoh, Y., "Analysis for Dislocation Density Reduction in Selective Area Grown GaAs Films on Si Substrates," *Appl. Phys. Lett.*, vol. 56.1, American Institute of Physics, Jan. 1, 1990, pp. 27–29.

Fitzgerald, E.A., Chand, N., "Epitaxial Necking in GaAs Grown on Pre–Patterned Si Substrates," *Journal of Electronic Materials*, vol. 20.10, 1991, pp. 839–853.

Fitzgerald, E.A., "The Effect of Substrates Growth Area on Misfit and Threading Dislocation Densities in Mismatched Heterostructures," *J. Vac. Sci. Technol. B*, vol. 7.4, American Vacuum Society, Jul./Aug. 1989, pp. 782–788.

Noble, D.B., Hoyt, J.L., King, C.A., Gibbons, J.F., Kamins, T.I., Scott, M.P., "Reduction in Misfit Dislocation Density by the Selective Growth of SI$_{1-x}$Ge$_x$/SI in Small Areas," *Appl. Phys. Lett.*, vol. 56.1, American Institute of Physics, Jan. 1, 1990, pp. 51–53.

Luryi, S., Suhir, E., "New Approach to the High Quality Epitaxial Growth of Lattice–Mismatched Materials," *Appl. Phys. Lett.*, vol. 49.3, American Institute of Physics, Jul. 21, 1986, pp. 140–142.

Mii, Y.J., Lin, T.L., Kao, Y.C., Wu, B.J., Wang, K.L., Nieh, C.W., Jamieson, D.N., Liu, J.K., "Studies of Molecular–Beam Epitaxy Growth of GaAs on Porous Si Substrates," *J. Vac. Sci. Technol. B*, vol. 6.2, American Vacuum Society, Mar./Apr. 1988, pp. 696–698.

Xie, Y.H., Bean, J.C., "From Porous SI to Patterned SI Substrate: Can Misfit Strain Energy in a Continuous Heteroepitaxial Film Be Reduced?" *J. Vac. Sci. Technol. B*, vol. 8.2, American Vacuum Society, Mar./Apr. 1990, pp. 227–231.

Lo, Y.H., "New Approach to Grow Pseudomorphic Structures Over the Critical Thickness," *Appl. Phys. Lett.*, vol. 59.18, American Institute of Physics, Oct. 28, 1991, pp. 2311–2313.

Powell, A.R., Iyer, S.S., LeGoues, F.K., "New Approach to the Growth of Low Dislocation Relaxed SiGe Material," *Appl. Phys. Lett.*, vol. 64.14, American Institute of Physics, Apr. 4, 1994, pp. 1856–1858.

Meyer, M., "More Growth in Communications," *Compound Semiconductor*, vol. 7.1, Feb. 2001, pp. 47–48.

Zubia, D., Zaidi, S.H., Brueck, S.R.J., Hersee, S.D., "Nano-heteroepitaxial Growth of GaN on Si by Organometallic Vapor Phase Epitaxy," *Applied Physics Letters*, vol. 76.7, American Institute of Physics, Feb. 14, 2000, pp. 858–860.

Kuang, J.B., Chen, Y.K., Sivco, D., Cho, A.Y., Eastman, L.F., "High—Current Lattice–Strained IN$_{0.59}$Ga$_{0.41}$As/In$_{0.52}$Al$_{0.48}$As Modulation–Doped Field–Effect Transistors Grown By Molecular Beam Epitaxy," *Appl. Phys. Lett.*, vol. 57.17, American Institute of Physics, Oct. 22, 1990, pp. 1784–1786.

Honda, Y., Iyechika, Y., Maeda, T., Miyake, H., Hiramatsu, K., "Transmission Electron Microscopy Investigation of Dislocations in GaN Layer Grown By Facet–Controlled Epitaxial Lateral Overgrowth," *Jpn. J. Appl. Phys.*, vol. 40, The Japan Society of Applied Physics, Apr. 1, 2001, pp. L309–L312.

Malag, A., "Simple Interference Method of Diffraction Grating Generation for Integrated Optics by the Use of a Fresnel Mirror," *Optics Communications*, vol. 32.1, Jan. 1980, pp. 54–58.

Zaidi, S.H., Brueck, S.R.J., "High Aspect–Ratio Holographic Photoresist Gratings," *Applied Optics*, vol. 27.14, Optical Society of America, Jul. 15, 1988, pp. 2999–3002.

Kopalidis, P.M., Jorne, J., "Langmuir Probe Measurements and Characterization of Silicon Etching in SF$_6$/O$_2$ Discharges," *Electrochem. Soc.*, vol. 139.3, The Electrochemical Society, Inc., Mar. 1992, pp. 839–844.

Bean, K.E., "Anisotropic Etching of Silicon," *IEEE Transactions on Electron Devices*, vol. ED–25.10, IEEE, Oct. 1978, pp. 1185–1192.

Zaidi, S.H., Chu, A.–S., Brueck, S.R.J., "Optical Properties of Nanoscale, One–Dimensional Silicon Grating Structures," *J. Appl. Phys.*, vol. 80.12, American Institute of Physics, Dec. 15, 1996, pp. 6997–7008.

Madou, M.J., *Fundamentals of Microfabrication: The Science of Miniaturization*, Second Edition, CRC Press, New York, 2002.

Zaidi, S.H., Ruby, D.S., Gee, J.M., "Characterization of Random Reactive Ion Etched–Textured Silicon Solar Cells," *IEEE Transactions on Electron Devices*, vol. 48.6, IEEE, Jun. 2001, pp. 1200–1206.

Kao, D.-B., McVittie, J.P., Nix, W.D., Saraswat, K.C., "Two–Dimensional Thermal Oxidation of Silicon–I. Experiments," *IEEE Transactions on Electron Devices*, vol. ED–34.5, IEEE, May 1987, pp. 1008–1017.

Turner, D.R., "Electropolishing Silicon in Hydrofluoric Acid Solutions," *Journal of the Electrochemical Society*, vol. 105, Jul. 1958, pp. 402–408.

Ottow, S., Lehmann, V., Foll, H., "Processing of Three–Dimensional Microstructures Using Macroporous n–type Silicon," *J. Electrochem. Soc.*, vol. 143.1, The Electrochemical Society, Inc., Jan. 1996, pp. 385–390.

Ohji, H., French, P.J., Tsutsumi, K., "Fabrication of Mechanical Structures in p–type Silicon Using Electrochemical Etching," *Sensors and Actuators*, vol. 82, Elsevier Science S.A., 2000, pp. 254–258.

Wehrspohn, R.B., Chazalviel, J.-N., Ozanam, F., "Macropore Formation in Highly Resistive p–type Crystalline Silicon," *J. Electrochem. Soc.*, vol. 145.8, The Electrochemical Society, Inc., Aug. 1988, pp. 2958–2961.

Zaidi, S.H., and Brueck, S.R.J., "Photoluminescence of Manufactured 1–D Crystalline Si Gratings," *Optics Communications*, vol. 135, Elsevier Science B.V., 1997, pp. 264–268.

* cited by examiner

NANOSTRUCTURES FOR HETERO-EXPITAXIAL GROWTH ON SILICON SUBSTRATES

RELATED CASES

The present patent application claims the benefit of Provisional Application Ser. No. 60/332,677 filed on Nov. 16, 2001 for "Method Of Using Nanostructures For Improving Hetero-Epitaxial Growth On Silicon Substrates."

STATEMENT REGARDING FEDERAL RIGHTS

This invention was made in part with government support under Contract No. F33615-01-M-5410 between the U.S. Department of Defense and Gratings Incorporated, a New Mexico corporation. The government has certain rights in the invention.

FIELD OF THE INVENTION

The present invention relates generally to the growth of heteroepitaxial layers on silicon (Si) substrates and, more particularly, to the use of micro- and nanoscale, 1-dimensional and 2-dimensional periodic and random structures generated on silicon and other substrates for forming compliant, thin films suitable for gettering defects and for accommodating lattice and thermal expansion mismatches during heteroepitaxial growth thereon.

BACKGROUND OF THE INVENTION

Heteroepitaxial growth of pseudomorphic compound semiconductor films on silicon (Si) substrates has been a subject of enduring commercial interest due in part to applications in optoelectronics integrated circuits (See, e.g., O. Wada and J. Crow in *Integrated Optoelectronics*, edited by M. Dagenais et al., Academic Press (1995)), and low-cost, low-weight, high-efficiency solar cells having high mechanical strength (See, e.g., S. R. Messenger et al., 26$^{th}$ IEEE PVSC, 995 (1997)). High-quality heteroepitaxial growth on Si substrates beyond critical thickness $h_c$ is difficult to realize because of lattice constant and thermal expansion coefficient mismatches. For example, lattice expansion mismatch leads to misfit and threading dislocations resulting in a well-known crosshatch pattern for a SiGe layer system (See, e.g., *Germanium-Silicon Strained Layers and Heterostructures*, Suresh C. Jain, Advances in Electronics and Electron Physics, Supplement 24, Academic Press (1994)). Due to a large thermal expansion coefficient mismatch during for cooling after growth; that is, between $8.35 \times 10^{-6}$ and $5.9 \times 10^{-6}$ for germanium (Ge) and between $4.27 \times 10^{-6}$ and $2.57 \times 10^{-6}$ for Si (See, e.g., M. T. Currie et al., Appl. Phys. Lett. 72, 1718 (1998)), a high density of microcracks (See, e.g., B. G. Yacobi et al., Appl. Phys. Lett. 51, 2236 (1987)) and wafer bowing (See, e.g., S. Sakai, Appl. Phys. Lett. 51, 1069 (1987)) has been observed.

For these types of lattice and thermal expansion mismatched systems, the performance of minority carrier devices such as solar cells and laser diodes is degraded due to enhanced recombination at the lattice dislocations (See, e.g., P. M. Sieg et al., Appl. Phys. Lett. 73, 3111 (1998)), although moderately successful majority carrier devices have been reported (See, e.g., R. M. Sieg et al., J. Vac. Sci. Technol. B16, 1471 (1998)). Research directed to growth of high-quality (defect density $<10^5$ cm$^{-2}$) heteroepitaxial films on Si substrates has been a field of active research for many years.

Several distinct approaches have evolved with varying levels of success:

A. Graded Layer Approach

One manner of eliminating, or reducing lattice and thermal mismatches is to form a "virtual" substrate by growing a graded composition of the desired heteroepitaxial film on a defect-free Si substrate (See, e.g. D. J. Paul, Adv. Mater. 11, 191 (1999)). A layer having constant composition and the desired lattice parameter can then be grown on this buffer layer. By grading the composition, the misfit strain is distributed throughout the buffer layer thickness resulting in a three-dimensional misfit dislocation network. The primary objective of the constant composition layer is to achieve complete relaxation along with spatial separation from the underlying network of dislocations. Graded SiGe films have been prepared with low (between $10^5$ and $10^6$ cm$^{-2}$) defect densities (See, e.g., J. H. Li et al., J. Appl. Phys. 82, 2881 (1997)). However, several difficulties remain with this approach including surface roughness due to a pronounced <110> crosshatch pattern that creates difficulties in lithographic patterning (See, e.g., M. A. Lutz et al., Appl. Phys. Lett. 66, 724 (1995)). Moreover, as the germanium concentration is increased, the crosshatch surface roughens further leading to an overlap of underlying strain fields, which tends to block threading dislocation glide and enhances dislocation pileups (See, e.g., S. B. Samavedam and E. A. Fitzgerald, J. Appl. Phys. 81, 3108 (1997)).

For GaAs on Si, similar approaches have been developed. A stress-balance approach based on GaAs$_{1-x}$P$_x$ (See, e.g., A. Freundlich et al., Appl. Phys. Lett. 59, 3568 (1991)) and AlAs (See, e.g., J. D. Boeck et al., Appl. Phys. Lett. 59, 1179 (1991)) buffer layers has been investigated. An alternative approach is the application of strained layer super lattices of GaP/GaAsP and GaAsP/GaAs to relax lattice mismatch between GaP and GaAs (See, e.g., T. Soga et al., J. Cryst. Growth 77, 498 (1986)). However, there remain problems with a high-density of defects in thick GaAs films and in achieving single domain structure over the entire substrate due to thermal expansion coefficient mismatch between GaAs and Si. This results in stress and changes in lattice constant and band structure for GaAs grown on Si from those grown on GaAs substrates.

B. Finite Area Growth

Mathews, et al., first proposed that limiting the lateral dimensions of the sample prior to growth could reduce the density of threading dislocations (See, e.g., J. W. Mathews et al., J. Appl. Phys. 41, 3800 (1970)). Subsequently, this approach has been extensively investigated for a wide range of material systems. Fitzgerald, et al. investigated misfit dislocations in growth of In$_{0.05}$Ga$_{0.95}$ films on 2-μm-high mesas having various lateral dimensions and geometries on (001) GaAs substrates (See, e.g., E. A. Fitzgerald et al., Appl. Phys. Lett. 52, 1496 (1988)). A reduction of linear interface dislocation density from about 5000/cm to approximately 800/cm for mesas as large as 100 μm was demonstrated. Yamaguchi et al. in Appl. Phys. Lett. 56, 27 (1989) and E. A. Fitzgerald and N. Chand in J. Electron. Mat., 20, 839 (1991) later extended this approach to GaAs growth on patterned Si substrates. Yamaguchi, et al., teaches that the dislocation density of GaAs on Si is due to thermal stress, and that some stress relief is provided by the finite edges resulting in the reduction in dislocation density. Defect densities were reduced to approximately $1 \times 10^{-6}$ cm$^{-2}$ by a combination of thermal cycle annealing and lateral dimensions of about 10 μm.

Defect densities have the potential of being reduced to $<10^5$ cm$^{-2}$ by growth on substrates with finer lateral dimensions. The finite growth region can either be defined by vertical etching (See, e.g., E. A. Fitzgerald, J. Vac. Sci. Technol. B7, 782 (1989)), or use of an oxide mask (See, e.g., D. B. Noble et al., Appl. Phys. Lett. 56, 51 (1990)).

C. Growth on Nanoscale Structures

In modeling critical layer thickness, $h_c$, of strained hetero layers on lattice mismatched nanostructured substrates, Luryi and Suhir determined that critical layer thickness increases sharply as finite seed areas are reduced (See, e.g., S. Luryi and E. Suhir, Appl. Phys. Lett. 49, 140 (1986)). According to this model, for Ge on Si, seed dimensions required are about 10 nm with a separation of approximately 3 nm, which eliminates most low-cost lithographic systems. Porous Si films support somewhat similar structures, and several growth studies were undertaken to evaluate model predictions. GaAs films grown on porous Si were found to contain a high density of microtwins and stacking faults originating from the roughness of the porous Si interface (See, e.g., Y. J. Mii et al., J. Vac. Sci. Technol. B6, 695 (1988)). $Ge_xSi_{1-x}$ films grown on porous Si showed a predominance of 60° dislocations with long misfit segments (See, e.g., Y. H. Xie and J. C. Bean, J. Vac. Sci. Technol. B8, 227 (1990)). In both cases, no reduction in either strain or dislocation density was observed when compared to growth on planar areas. This lack of agreement with the model may be attributed to the interconnected nature of porous Si structure as opposed to the isolated trenches assumed in the model.

D. Growth on Compliant Substrates

An alternative model was later proposed by Lo (See, e.g., Y. H. Lo, Appl. Phys. Lett. 59, 3211 (1991)) based on the premise that strain is predominant in the epitaxial thin film, since the substrate is too thick to be compliant. In case of thin film substrate, the elastic energy between the epilayer and the substrate is more evenly distributed. Therefore, for the limiting case of a freestanding film, the strain energy is insufficient to generate misfit locations regardless of the epilayer thickness. According to Lo, growth is improved by two mechanisms: (a) increasing effective critical thickness; and (b) gettering of threading dislocations by freestanding thin films. An experimental verification of this approach was provided by Powell et al., for $Si_{1-x}Ge_x$ growth on 50-nm-thick Si films in SOI configuration (See, e.g., A. R. Powell et al., Appl. Phys. Lett. 64, 1856 (1994)). Transmission electron microscope (TEM) measurements showed that for x=0.15 and SiGe layer thickness between 60 nm and 170 nm, no threading dislocations occurred in the SiGe layer; the underlying Si layer gettered all of the dislocations. Overall defect density was observed to be less than $10^5$ $cm^{-2}$, and the Si layer was found to have about $10^8$ $cm^{-2}$. However, in order to form thicker SiGe layers, or higher Ge concentration materials, Si thickness of approximately 10-nm thickness is required. This leads to the practical difficulty of the formation of thin (~5–10 nm) Si films. An alternative compliant approach has also been the focus recent work in which a single crystalline Strontium Titanium Oxide (STO) was used as a buffer layer between Si substrate and GaAs film (See, e.g., *Epitaxial Growth* by M. Meyer, *Compound semiconductor*, page 47, October (2001)). The STO film acts as a compliant layer, thereby reducing mechanical strain and thermal mismatch between substrate and GaAs epilayer.

Based on Lo et al., the experimental verification for thin films by Powell et al. and the work by M. Meyer, it appears that a compliant layer is a promising solution to resolving both the lattice and Thermal expansion mismatches.

E. Substrate Compliance With Nanoscale Structures

The theory developed by Mathews, Stoica, Yamaguchi, and Fitzgerald, et al., teaches that the density of misfit dislocations is reduced by decreasing seed pad dimensions due to the strain relaxation and escape of dislocations at the edges. The compliant layer model proposed by Luryi and Suhir and supported by work by Meyer is a logical extension of these concepts to extreme nanoscale seed dimensions that are beyond the limit of most lithography systems. The compliant substrate developed by Lo requires a freestanding thin-film that is difficult to realize in practice. Zubia and Hersee combine aspects of 3D stress-relief mechanisms as proposed by Luryi and Suhir with Lo's substrate compliance in SOI configuration (See, e.g., D. Zubia et al., Appl. Phys. Lett. 76, 858 (2000)). This model also predicts a significant relaxation of seed pad dimensions, from about 0.01 $\mu$m to approximately 0.1 $\mu$m. The patterned nanoscale islands in SOI configuration, although relatively compliant, have insufficient volume to absorb strain during growth of thick films. As growth fronts from nearest neighbors coalesce, defect density is significantly increased.

In pendeoepitaxy (PE) as taught by J. B. Kuang et al., Appl. Phys. Lett. 57, 1784 (1990), the vertical propagation of threading dislocations is blocked by using masks, while growth parameters are varied to enhance lateral growth, which is initiated on the sidewalls.

In facet-controlled epitaxial lateral growth as taught by Y. Honda et al., Jpn. J. Appl. Phys. 40, L309 (2001), vertical growth is encouraged until most of the threading dislocations are blocked, then lateral growth is enhanced leading to coalescence between growths from adjacent structures.

Accordingly, it is an object of the present invention to accommodate lattice and thermal expansion mismatches during growth of heteroepitaxial layers on suitable substrates.

Additional objects, advantages and novel features of the invention will be set forth, in part, in the description that follows, and, in part, will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with its purposes of the present invention, as embodied and broadly described herein, the method for accommodating lattice and thermal expansion mismatches during heteroepitaxial growth hereof includes the steps of: forming a grating structure on the surface of a substrate; generating a readily etchable layer physically separating the grating structure from the substrate; and epitaxially growing the desired heteroepitaxial layer at least on the grating structure, whereby lattice and thermal expansion mismatches between the substrate and the epitaxially grown film are reduced.

In another aspect of the invention and accordance with its objects and purposes, the apparatus for growing heteroepitaxial materials hereof includes: a substrate having a substantially flat surface; and a grating structure formed on the surface of the substrate, the grating structure being physically separated from the substrate by a readily etchable layer, whereby epitaxial materials grown on the grating structure have reduced lattice and thermal expansion mismatches.

Benefits and advantages of the present invention include significant reduction of cost and enhanced performance for epilayer growth on lattice-mismatched material systems.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 5a shows growth without coalescence; and FIG. 5b shows growth with coalescence.

FIG. 6a is a scanning electron microscope (SEM) output for a 1D grating formed in (110) Si using anisotropic KOH etching, while FIG. 6b is an SEM output for a 1D grating formed (100) Si using anisotropic reactive ion etching.

FIG. 7a is an SEM output for a one-dimensional triangular profile grating formed in (100) Si using KOH etching having a period of 0.3 $\mu$m, while FIG. 7b shows a one-dimensional triangular profile grating formed in (100) Si using KOH etching having a period of 0.65 $\mu$m.

FIG. 8a is an SEM output for a two-dimensional grating formed in (100) Si using anisotropic reactive ion etching and having a 2-D post pattern, while FIG. 8b is an SEM output for a two-dimensional grating formed in (100) Si using anisotropic reactive ion etching and having 2-D hole pattern.

FIG. 10a is an SEM output for a thin-film formed on a grating structure in (111) Si showing a 1-D pattern, while FIG. 10b shows a 2-D post pattern thereon, both structures having been generated using the sequence set forth in FIG. 9 hereof.

FIG. 11a is an SEM output for a 1-D structure having <111> symmetric profiles and a 1 $\mu$m period, while FIG. 11b is an SEM output of a 1-D structure having <111> symmetric profiles and a 10 $\mu$m period.

FIG. 13a is an SEM output showing inverted pyramids formed by combining reactive ion etching and wet-chemical etching on a Si substrate, while FIG. 13b is an SEM output showing rectangular walls isolated from the Si substrate using reactive ion etching and sidewall oxide film protection.

DETAILED DESCRIPTION

Figure 1:
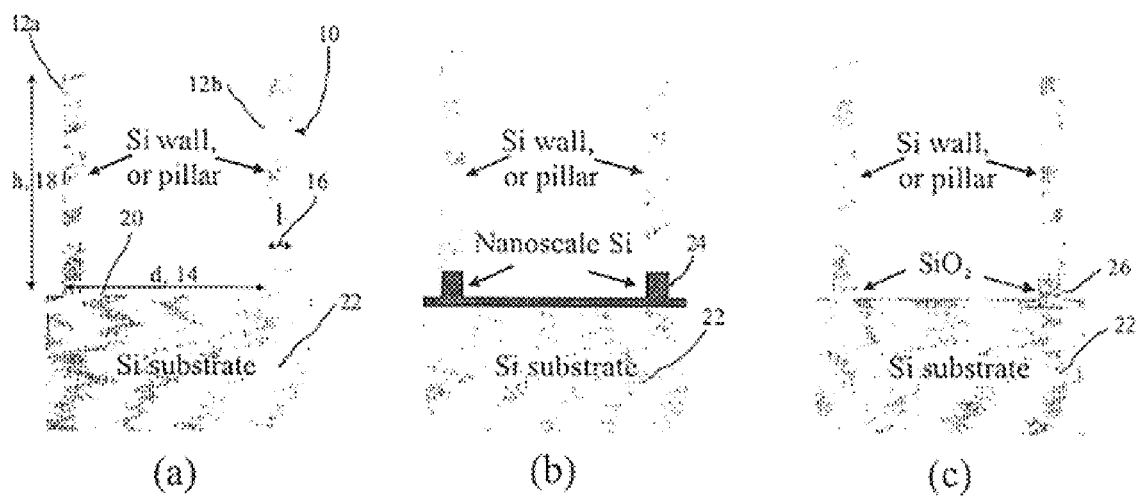
FIGS. 1a–1c are schematic representations of the vertical grating structure formed on a substrate in accordance with the teachings of the present invention for: a Si substrate, FIG. 1a; on a Si substrate, with a nanoporous Si layer separating the grating structure from the Si substrate, FIG. 1b; and on a Si substrate with an $SiO_2$ layer separating the grating structure from the Si substrate, FIG. 1c.

Briefly, the present invention includes a method for improving heteroepitaxial growth of epilayers in lattice expansion-coefficient-mismatched systems by generating micro- and nanoscale walls, columns, films, and V-grooves on the surface of a Si or other suitable substrate such that during epitaxial growth, strain energy is predominantly confined in these structures and defects are gettered. Pseudomorphic heteroepitaxial films having arbitrary thickness can therefore be grown.

Heteroepitaxial growth may be initiated on both sides of vertical sidewalls, thus, relaxing critical thickness requirement. Thin, horizontal surfaces can be generated with contact to the underlying Si substrates through compliant support structures formed with either silicon oxide (SiO$_2$), or nanoscale Si structures. The 1-D, or 2-D sidewalls for heteroepitaxial growth need not be vertical.

Structures may be configured such that the heteroepitaxial layer can be readily lifted off from the substrate, allowing the substrate to be reused.

Reference will now be made in detail to the present preferred embodiments of the invention examples of which are illustrated in the accompanying drawings. In what follows, identical callouts will be used for similar or identical structure.

FIG. 1a hereof shows a schematic representation of the general structure, 10, of the present invention. A one-dimensional (1-D) or two-dimensional (2-D) grating structure, 12, having period (d), 14, feature width (l), 16, and depth (h), 18, is fabricated on the front polished surface, 20, of a Si wafer, 22. FIG. 1b shows the same grating structure as in FIG. 1a, except that the grating lines are isolated from the underlying substrate by a nanoporous Si film, 24. FIG. 1c again shows the same grating structure as in FIG. 1a, except that the grating lines are separated from the underlying substrate by a thermally grown SiO$_2$ film, 26, leading to a silicon-on-insulator (SOI) configuration. The presence of nanoporous or oxide films between grating structures and Si substrate serves two purposes: (a) absorbing thermal expansion mismatch between the epilayer and the substrate, and (b) enabling heteroepitaxial layer removal by etching the readily etched nanoporous or oxide films.

FIG. 2a shows a schematic representation of an alternate embodiment in which heteroepitaxial growth is carried out on planar one-dimensional (1-D) or two-dimensional (2-D) thin-film surfaces, 28. A grating structure having period, 14, feature width, 16, height, 18, and top film thickness, 30, is fabricated on the front polished surface, 20, of Si wafer, 22. In the configuration shown, the top film thickness, 30, is approximately equal to the feature width, 16. FIG. 2b shows the same structure as shown in FIG. 2a, except that the grating thin-film structure is isolated from the underlying substrate by nanoporous Si film, 24. FIG. 2c shows the same structure as in FIG. 2a except that the thin-film layer is isolated from the underlying substrate by a thermally grown silicon oxide (SIO$_2$), 26. The thickness of the film is chosen such that heteroepitaxial growth defects are minimized.

Figure 3:
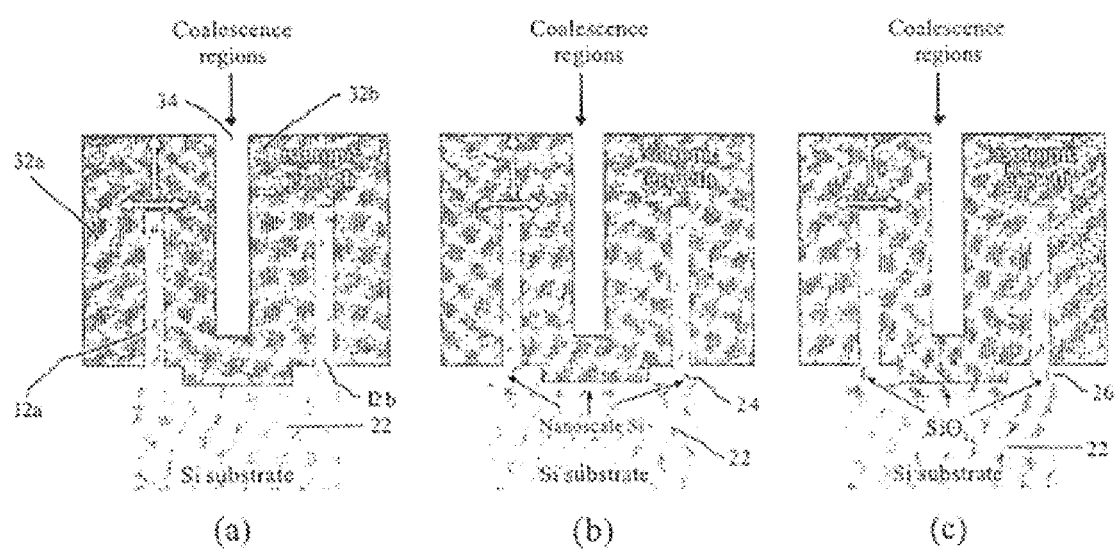
FIGS. 3a–3c are schematic representations illustrating heteroepitaxial growth on the vertical grating structure shown in FIG. 1 hereof for: a Si substrate, FIG. 3a; on a Si substrate, with a nanoporous Si layer separating the grating structure from the Si substrate, FIG. 3b; and on a Si substrate with an $SiO_2$ layer separating the grating structure from the Si substrate, FIG. 3c.

FIG. 3 shows a schematic representation of simultaneous heteroepitaxial growth on both sidewalls of grating structures shown in FIG. 1. Simultaneous growth on both sidewalls of features 12a and 12b is expected to lead to a relaxation of the minimum critical thickness which is estimated to be about 0.01 μm for planar films. In certain situations, period 14 is chosen such that a space, 34, remains between epitaxial growth regions 32a and 32b. Other films may be grown such that space 34 coalesces.

Figure 2:
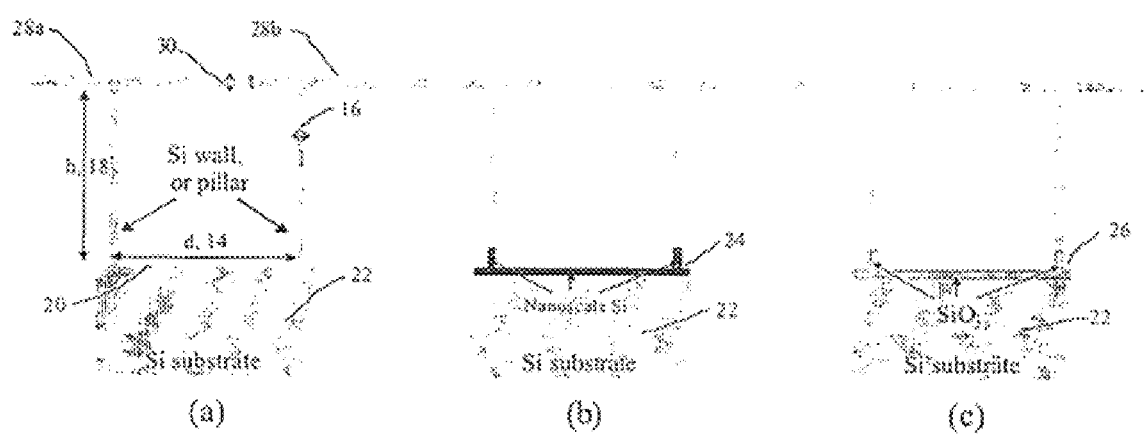
FIGS. 2a–2c are schematic representations of thin-film layers formed on the grating structure illustrated in FIG. 1 hereof for: a Si substrate, FIG. 2a; on a Si substrate, with a nanoporous Si layer separating the grating structure from the Si substrate, FIG. 2b; and on a Si substrate with an $SiO_2$ layer separating the grating structure from the Si substrate, FIG. 2c.
Figure 4:
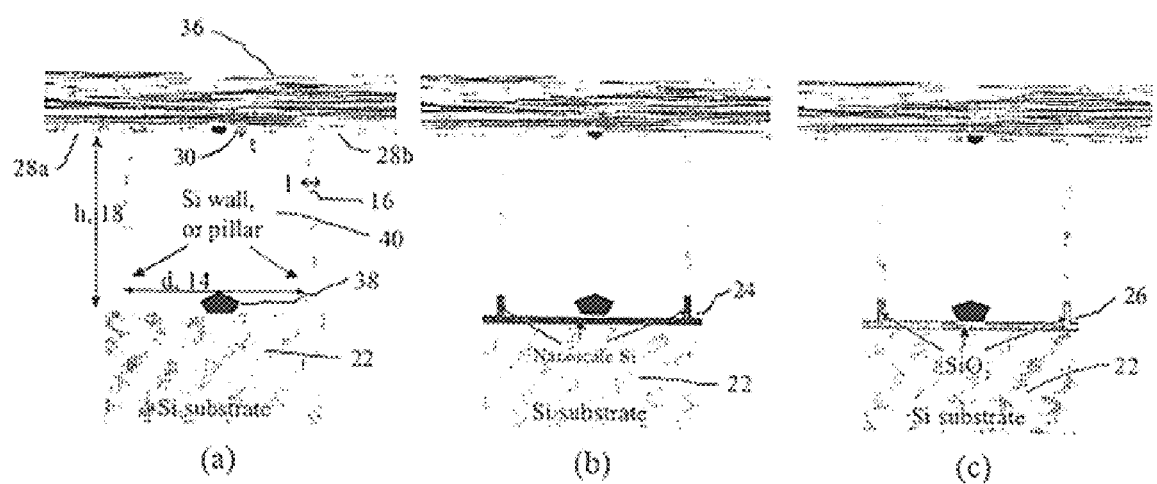
FIGS. 4a–4c are schematic representations showing heteroepitaxial growth on the thin-film layers illustrated in FIG. 2 hereof for: a Si substrate, FIG. 4a; on a Si substrate, with a nanoporous Si layer separating the grating structure from the Si substrate, FIG. 4b; and on a Si substrate with an $SiO_2$ layer separating the grating structure from the Si substrate, FIG. 4c.

FIG. 4 shows a schematic of heteroepitaxial growth, 36, on thin-film layers, 28a and 28b, shown in FIG. 2. Since the layer thickness 30 can be reduced to extremely fine thicknesses (between 5 nm and 10 nm), the thin-film is expected to act as a compliant thin film gettering all the defects from the heteroepitaxially grown film. Shown in FIG. 4 is material, 38, which entered void, 40, during the heteroepitaxial growth process.

Figure 5:
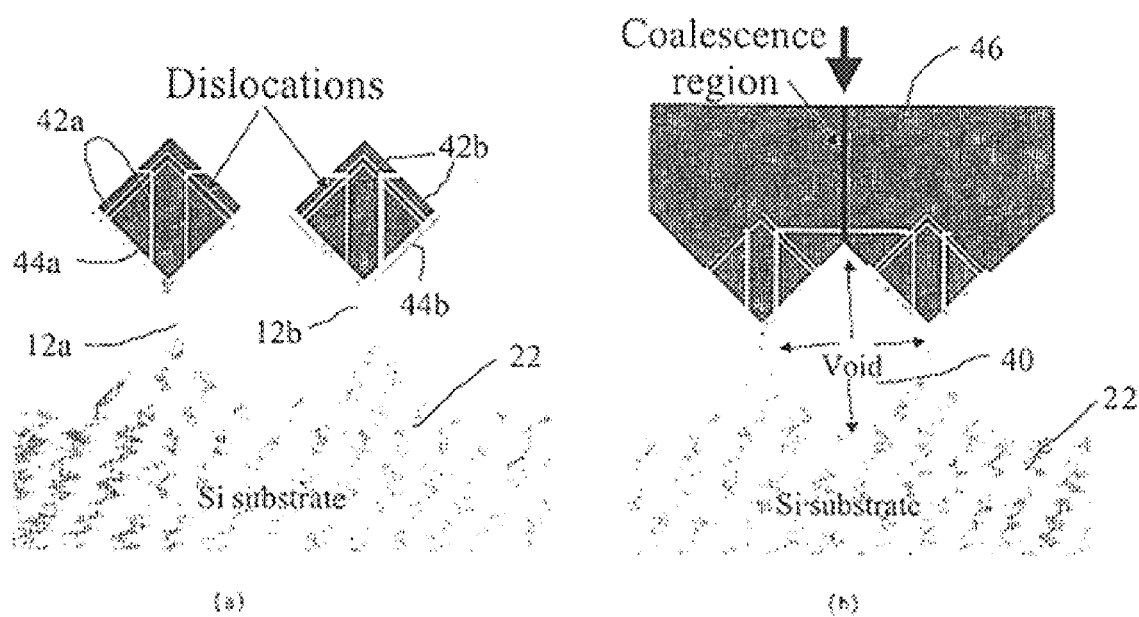
FIGS. 5a–5b are schematic representations showing heteroepitaxial growth on V-shaped formations formed on the grating structure illustrated in FIG. 1 hereof where.

FIG. 5 shows another embodiment of the present invention in which heteroepitaxial growth occurs on <111> Si sidewalls, 42a and 42b, of a conventional one-dimensional (1-D) or two-dimensional (2-D) V-groove, 44a, 44b. Growth on such a structure is potentially advantageous due to termination of threading defects on the <111> sidewalls. In a similar manner to the configurations illustrated in FIG. 1 and FIG. 2 hereof, the top V-groove pattern can be isolated from the underlying Si substrate either using a nanoporous or oxide film, not shown in FIG. 5a. The micro- and nanoscale vertical, horizontal, and V-groove patterns are designed to function as gettering centers which allow defects to escape, while keeping the heteroepitaxial film relatively free of defects as well. FIG. 5b shows the continued growth of the heteroeptaxial material, 46, across the coalescence break 34.

1. Fabrication of Submicrometer Periodic Structures in Silicon

Submicron periodic grating structures can be most conveniently formed using laser interference techniques. A. Malag in Opt. Commun. 32, 54 (1980), and Saleem H. Zaidi and S. R. J. Brueck, in Appl. Opt. 27 (1980) describe typical fabrication techniques for these types of one and two-dimensional structures. Interference between two coherent laser beams produces a simple periodic pattern at d=λ/2 sinθ, where λ is the exposure wavelength, and 2θ is the angle between the intersecting laser beams. For λ=0.355 μm and θ=60°, structures having periods down to about 0.2 μm can readily be fabricated. Typically, grating structures are first formed in a photoresist followed by pattern transfer to the substrate using an appropriate combination of wet and dry etching techniques. Silicon reactive ion etching (RIE) techniques have been well characterized (see, e.g., P. M. Kopalidis and J. Jorne, J. Electrochem. Soc., 139 (1992) for a description of Si etching in SF$_6$/O$_2$ plasmas). Wet-chemical etching of Si is also well understood (see, e.g., K. E. Bean, IEEE Trans. Elect. Dev., ED-25, 1185 (1978).

Figure 6:
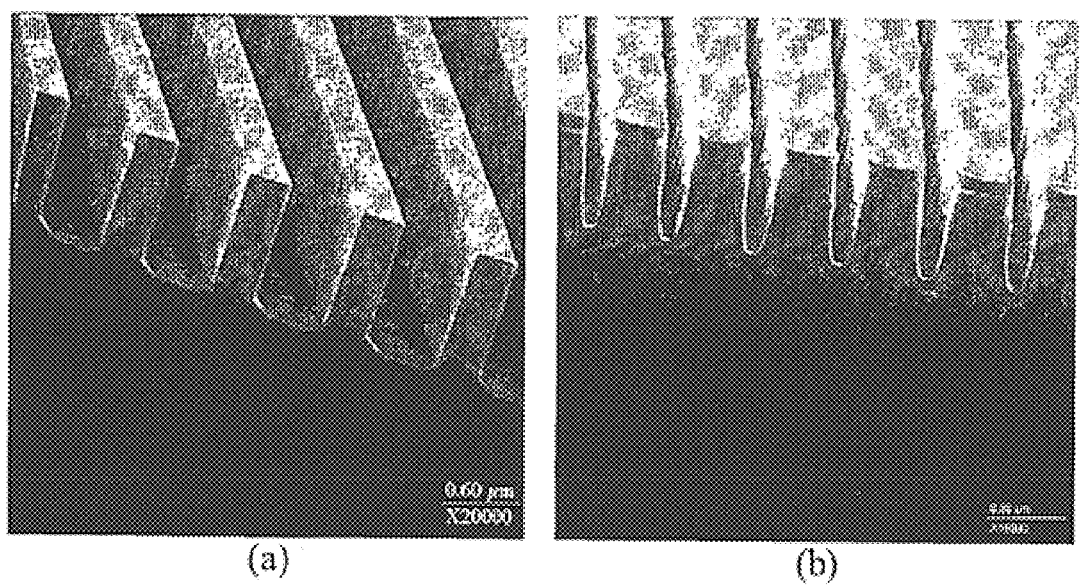
Figure 7:
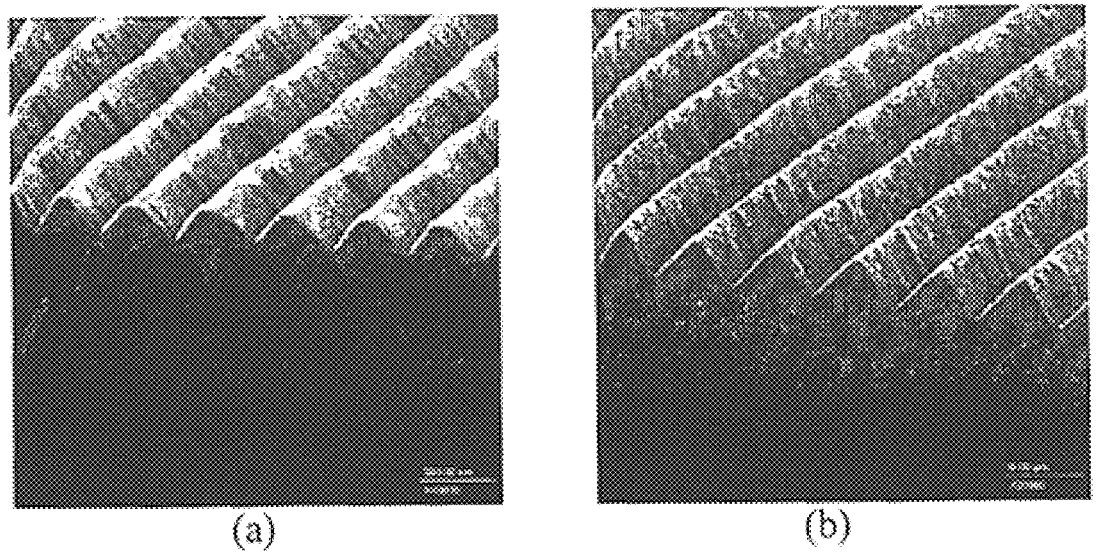
Figure 8:
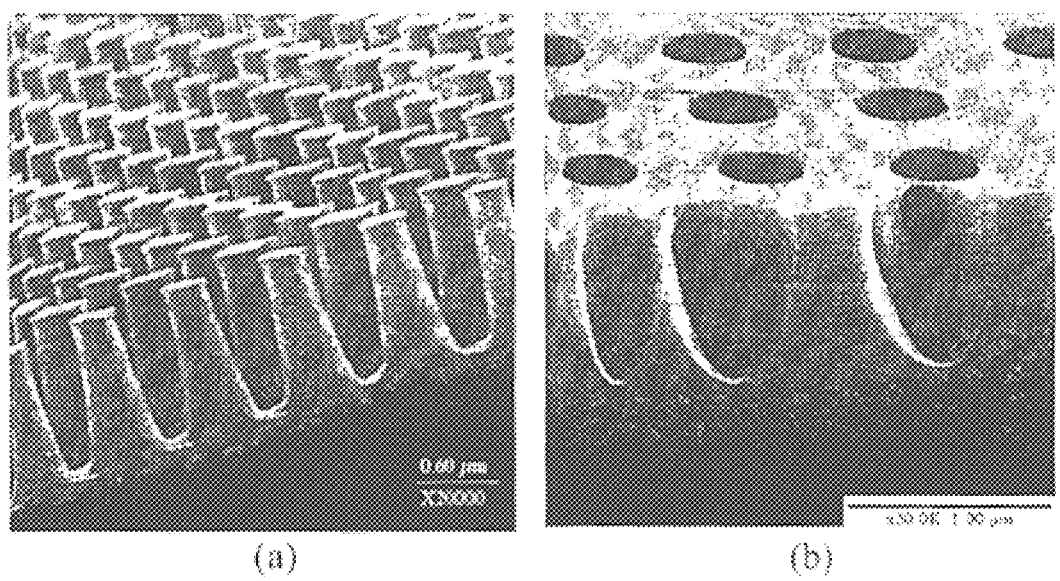

FIG. 6a shows scanning electron microscope (SEM) output for two 1-D grating structures formed in (110) and (100) Si using a 40% KOH solution and reactive ion etching (see, e.g., Saleem H. Zaidi et al., J. Appl. Phys. 80, 6997 (1996)). For these grating structures, linewidths were approximately 0.33 μm at a period of 1.0 μm (FIG. 6a) and about 0.6 μm (FIG. 6b) at a period of approximately 0.8 μm; depths were ~1 μm for both. FIG. 7 shows SEM output for two triangular-profiled gratings formed in (100) Si using 40% KOH solution and having periods between 0.3 μm (FIG. 7a) and 0.65 μm (FIG. 7b). FIG. 8a shows an SEM output profile for an 0.8 μm-period, 2-D pillar or post pattern and FIG. 8b shows a hole pattern, both formed by reactive ion etching (RIE) using SF$_6$/O$_2$ plasma chemistry described hereinabove. The posts in FIG. 8a are characterized by FWHM linewidths of about 0.4 μm, and an etch depth of approximately 1.0 μm; the holes in FIG. 8b have a diameter of about 0.4 μm. For the RIE procedures, the following parameters apply: SF$_6$=14 sccm; O$_2$=12 sccm; pressure=10 mTorr; RF Power=50 Watt; and the etch mask used was Cr (about 30 nm thick).

Figure 9:
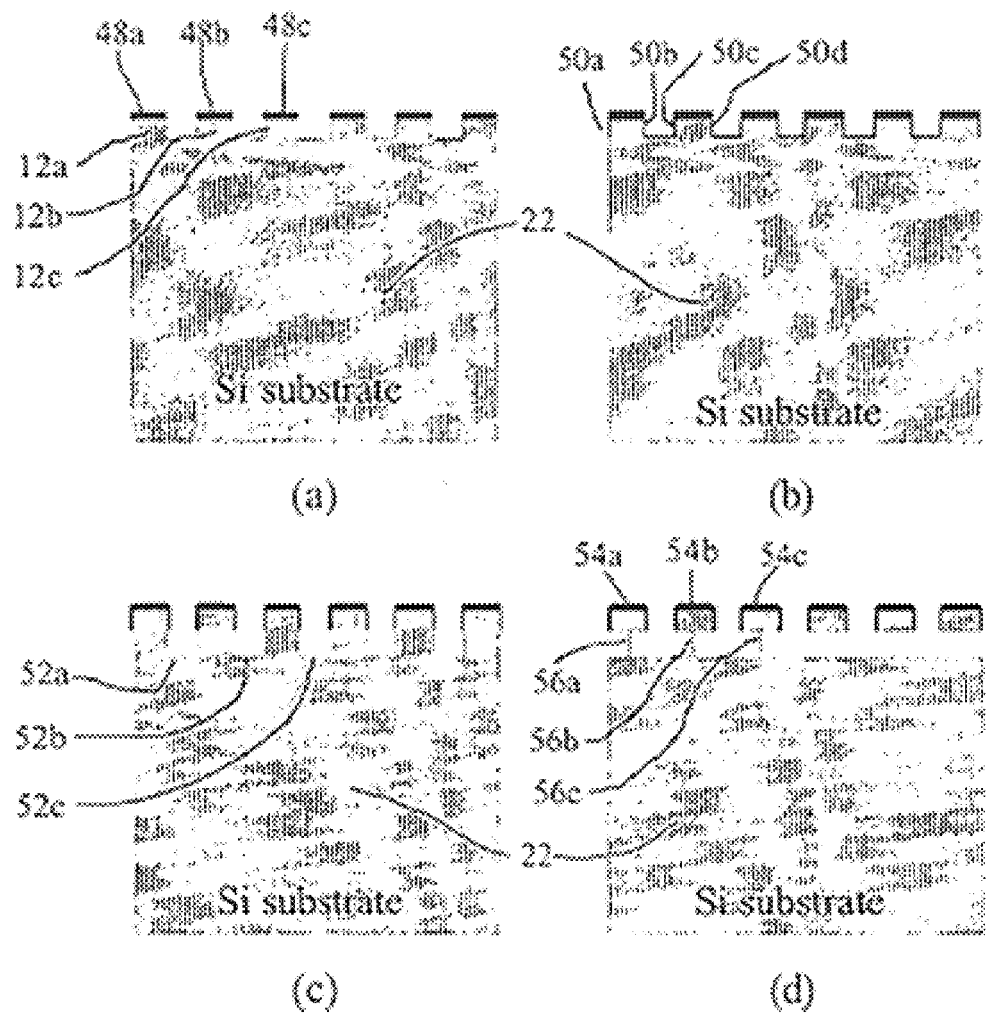
FIGS. 9a–9d illustrate a sequence of processing steps used to form thin-film structures parallel to a substrate in (111) Si, and is explained in detail hereinbelow.

More advanced structures can be fabricated by combining RIE and wet-chemical etching steps with oxidation and orientation-dependent etches. FIG. 9 provides a schematic diagram of one such etch process where the following processing steps are followed: (a) FIG. 9a illustrates the desired grating structure being etched into Si substrate 22 using etch masks, 48a–48c, to permit patterning perpendicular to the surface of the substrate 22 (<110> direction); (b) FIG. 9b illustrates thin film (oxide, nitride or silicon carbide), 50a–50d, deposited on the newly etched sidewalls to prevent further etching thereof; (c) a second reactive ion etching step is carried out to remove thin film between the grating grooves, 52a–52a, and etch the grooves to a suitable depth; and (d) the entire structure is subjected to an orientation-dependent etch process such as KOH, which etches lateral <110> planes at a much higher rate than the vertical <111> plane resulting in the structure comprising caps, 54a–54c, supported by posts, 56a–56c. Masks 48a–48c can be removed to expose a surface suitable for epitaxial growth.

Figure 10:
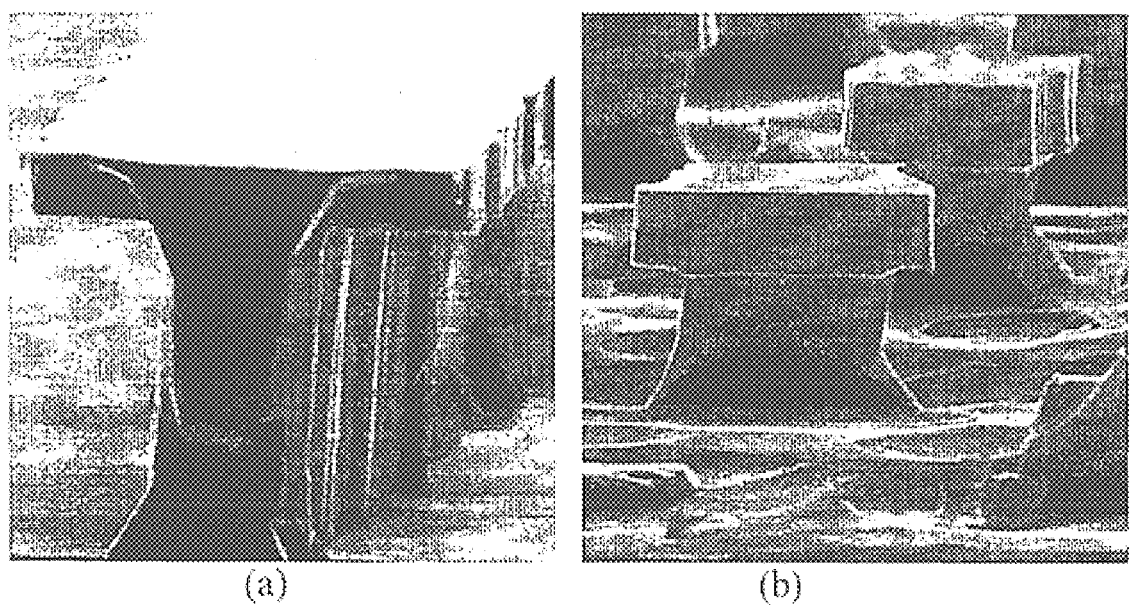
Figure 11:
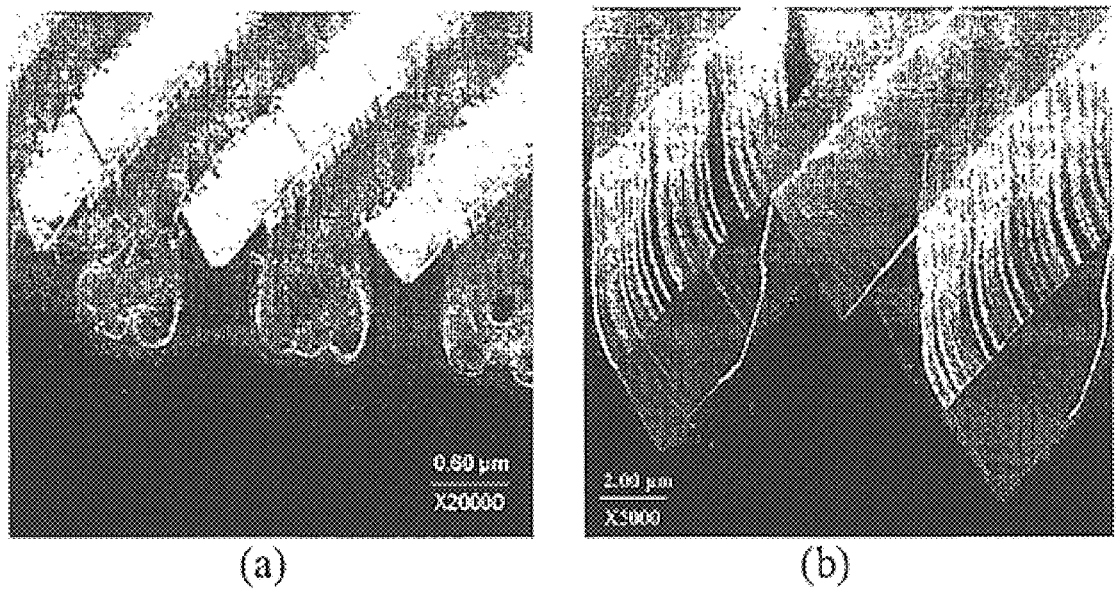

The thin-film structure shown in FIG. 10 hereof was fabricated in a <111> Si substrate using the process sequence of FIG. 9. Similar structures can be formed in the Si (100) crystal orientation if the masks are aligned at 45° to the <110> plane (See, e.g., *Fundamentals of Microfabrication* by Marc J. Madou, Second Edition, CRC press (2001)). The V-groove structures shown in FIG. 11 are formed by protecting the vertical sidewalls with an oxide or nitride film followed by KOH etching of the top surface.

Figure 12:
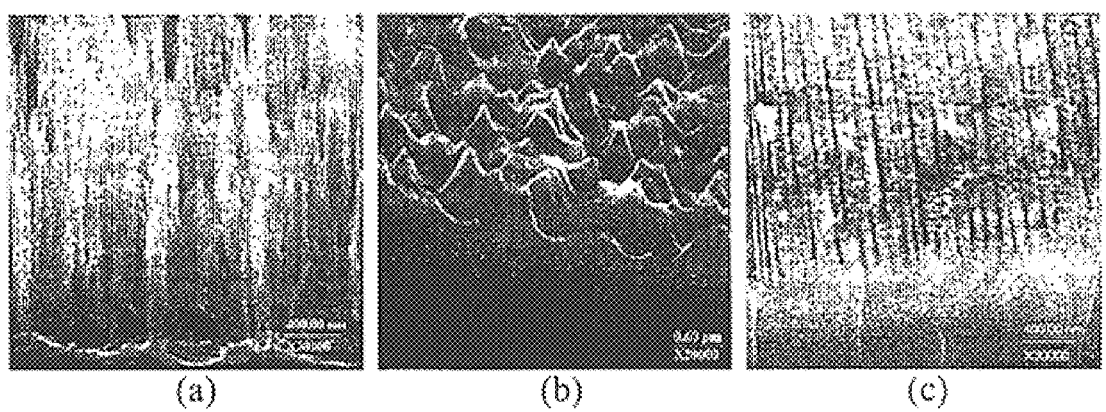
FIG. 12a is an SEM output for a randomly textured structure with columnar profiles generated by reactive ion etching.
FIG. 12b is an SEM output for a randomly textured structure with triangular profiles generated by reactive ion etching.
FIG. 12c is an SEM output for a randomly textured structure with deeply etched columnar profiles generated by anodic etching.

2. Randomly Spaced Silicon Nanostructures:

Randomly textured reactive ion etching techniques that have similar potential for heteroepitaxial growth applications have been developed (See, e.g., Saleem H. Zaidi et al., IEEE Trans. Elect. Dev. 48, 1200 (2001)). FIG. 11 shows examples of columnar (FIG. 12a) and triangular (FIG. 12b) structures. The columnar structures are characterized by depths of about 1.0 $\mu$m, separations of approximately 0.1 $\mu$m–0.2 $\mu$m, and linewidths of about 0.02–$\mu$m–0.04 $\mu$m. The Si linewidths in these structures can be further reduced through controlled oxidation processes described in Section 3, hereinbelow. FIG. 12c shows random nanoscale structures formed by anodic etching techniques also described hereinbelow.

3. Formation of Nanoscale Silicon Linewidths and Their Isolation

Figure 13:
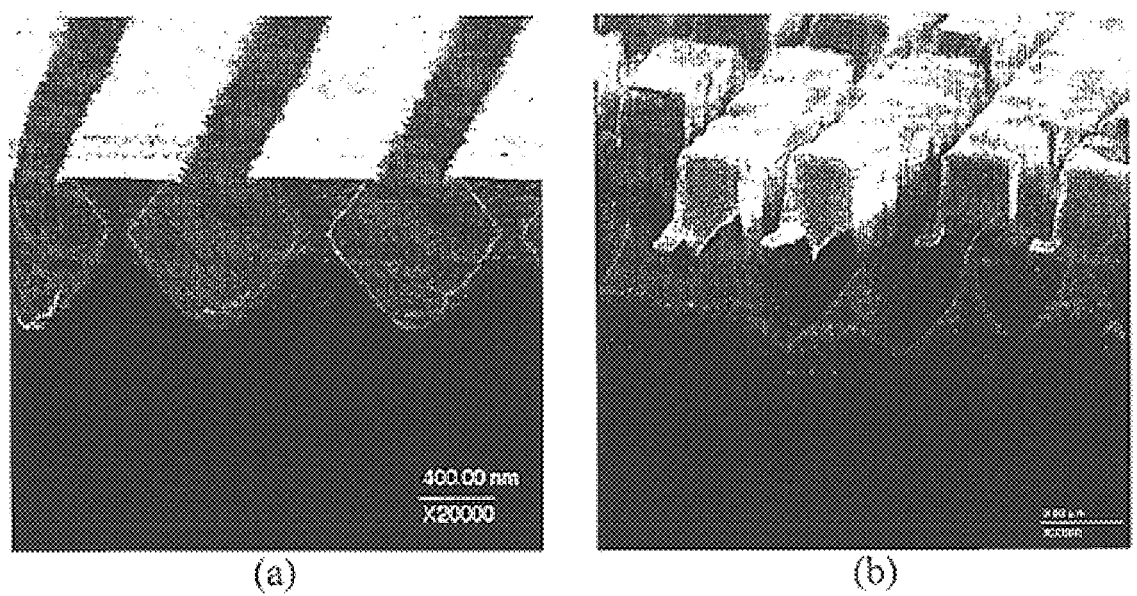
Figure 14:
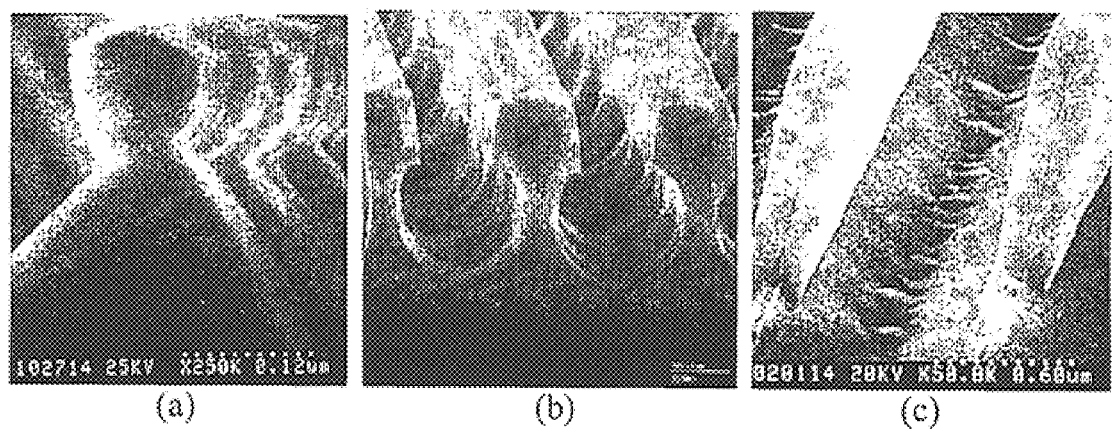
FIG. 14a is an SEM output for Si structures thinned using thermal oxidation showing triangular wires isolated from the substrate, FIG. 14b showing rectangular walls isolated from the substrate, and FIG. 14c showing approximately 20 nm-wide lines on a Si substrate.

A processing sequence based on RIE, wet-chemical etching, and oxide or nitride films has been developed to fabricate and isolate 1-D, or 2-D grating walls, or wires from the underlying substrate. FIG. 13a shows an example in which an inverted pyramid structure is formed at the top by anisotropic wet-chemical etching in 40% KOH solution following formation of a rectangular profile, such as that shown in FIG. 6b. FIG. 13b shows an RIE processes resulting in severe undercutting of grating walls from the substrate, vertical sidewalls being protected by oxide or nitride films. In most cases, the silicon linewidths of grating structures have to be reduced to between 0.01 $\mu$m and 0.02 $\mu$m in order to take advantage of 3-D stress-relief mechanisms. By controlled thermal oxidation, Si linewidths can be conveniently reduced to the desired dimensions (See, e.g., D. B. Kao et al., IEEE Trans. Elect. Dev. 34, 1008 (1987)). FIG. 14a shows an application of thermal oxidation processes to isolate Si wires from the substrate. FIG. 14b illustrates a similar oxidation process to form isolated walls from the underlying substrate. FIG. 14c shows the use of a controlled oxidation process to form approximately 0.022-$\mu$m linewidth Si walls.

Electrochemical etching of Si in HF solutions is a well-known method for micro- and nanoporous Si formation (See e.g., D. R. Turner, J. Electrochem. Soc. 105, 402 (1958)). For deep etching, the macroporous Si formation method in n-type Si appears to be highly desirable (See e.g., V. Lehman, J. Electrochem. Soc. 143, 385 (1996) and H. Ohji et al., Sensors and Actuators 82, 254 (2000)). In n-type (100) Si holes, as minority carriers, are responsible for etching reaction. In a typical experimental configuration, light illumination from the back surface of the Si wafer generates holes there which then diffuse to the front surface. Since the electric field is strongest at the pore tip, a majority of holes is consumed at the tip, resulting in near vertical etching of the Si. Therefore, in lightly doped, n-type Si, anisotropic etching is primarily attributed to hole-depletion effect. For p-type Si, the holes are already in a majority, so no illumination is required. However, in order to achieve anisotropic vertical etching, surface passivation agents are required. Recent work has demonstrated that profiles similar to n-type Si may be possible in p-type Si as well (see, e.g., R. B. Wehrspohn et al., J. Electrochem. Soc. 145, 2958 (1998)).

Figure 15:
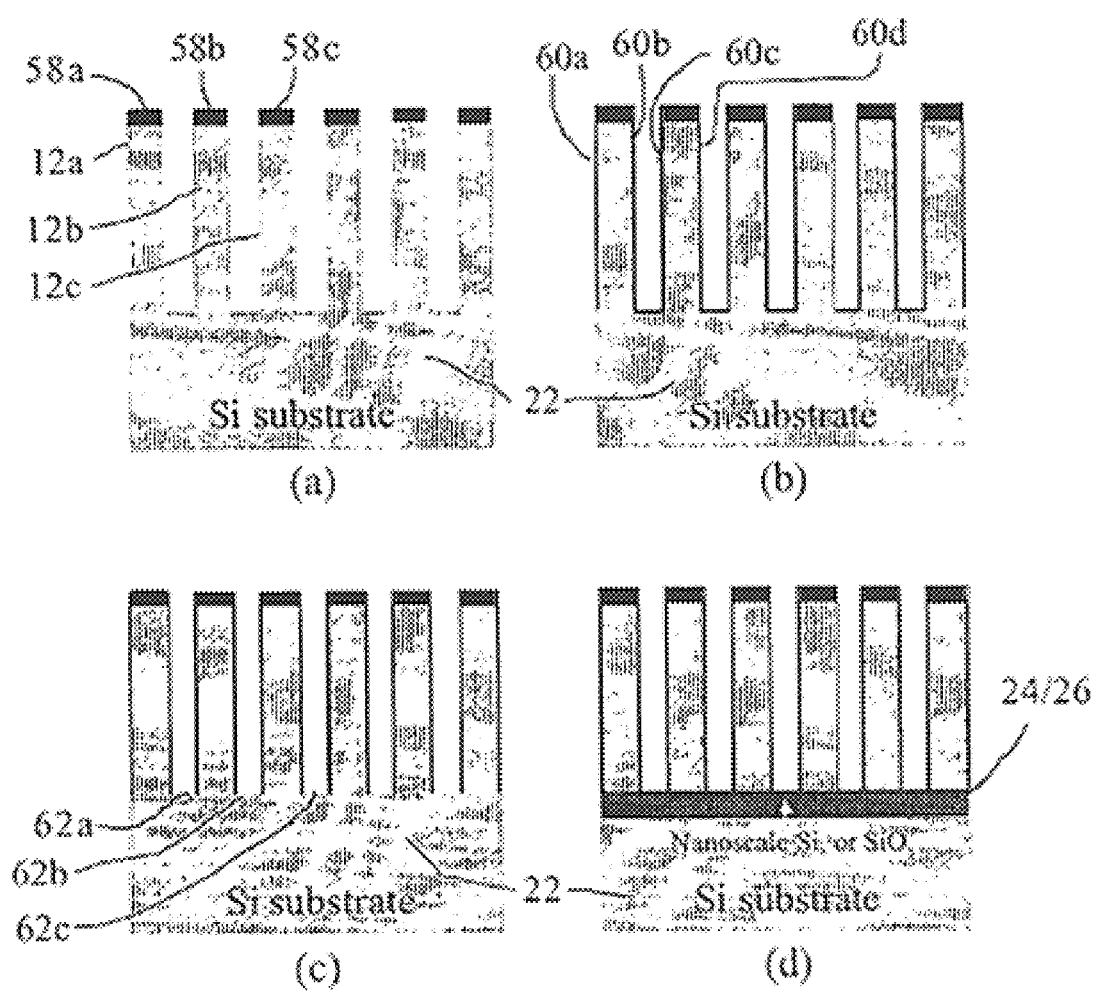
FIGS. 15a–15d shows the sequence of processing steps used to form nanoporous Si or $SiO_2$ under the grating structures, and is explained in detail hereinbelow.

For either n-, or p-type Si, anodic etching is a complex function of wafer resistivity, crystal orientation, surface preparation, current density, and illumination intensity. For nanoporous Si formation under grating structures, anodic etch process can be employed. FIG. 15 schematically shows a process for forming a nanoporous Si, or oxide spacing under the grating structure. The processing sequence consists of the following steps: (a) FIG. 15a shows a desired grating structure 12a–12c being etched into Si substrate 22 with etch masks, 58a–58c, in place; (b) FIG. 15b shows a thin film (nitride or silicon carbide), 60a–60d, being deposited on the sidewalls to protect against anodic etching; (c) FIG. 15c shows a reactive ion etching step carried out to remove thin film between grating grooves, 62a–62c; and (d) FIG. 15d illustrates the structure being subjected to an anodic etching process to convert the Si under grating structures 12a–12c into nanoporous film 24 or a thermal oxidation process is used to convert nanoporous Si into $SiO_2$, 26. Masks 58a–58c can now be removed for heteroepitaxial growth thereon.

Figure 16:
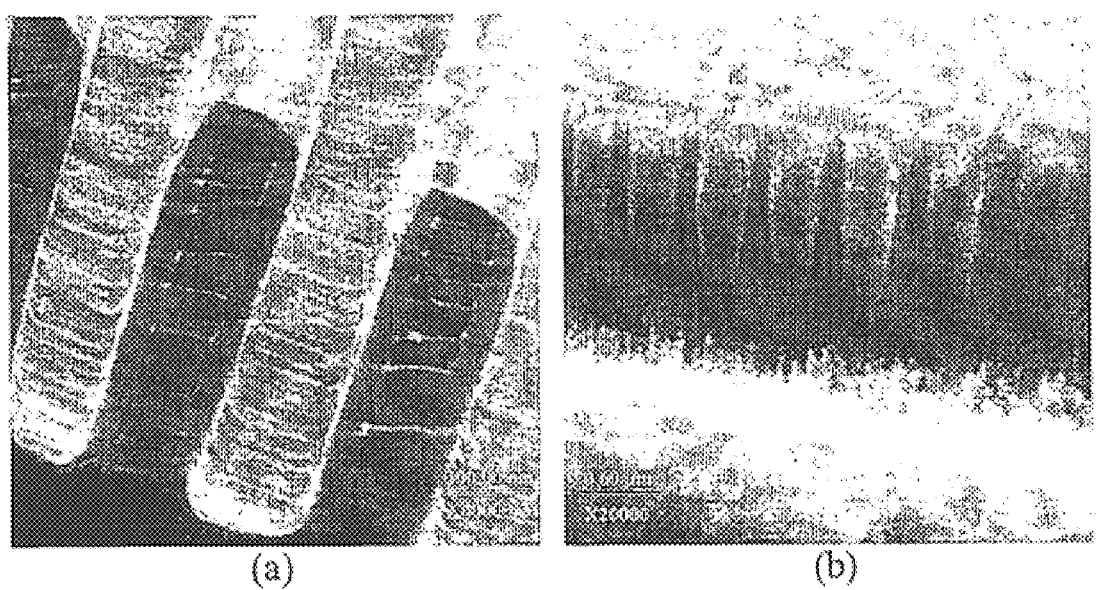
FIG. 16a is an SEM output for a sidewall oxide-protected Si grating structure.
FIG. 16b is an SEM output for a nanoporous Si layer under a 1-D grating structure.

FIG. 16a shows an example of a 1 $\mu$m period grating subjected to a process in which a thermal oxidation process was used to create a thin oxide film on the sidewalls, followed by a reactive ion etching step remove oxide at the bottom of the grating grooves. FIG. 16b shows a grating structure isolated from the substrate by an anodically etched, nanoporous Si layer using the process set forth hereinabove.

Figure 17:
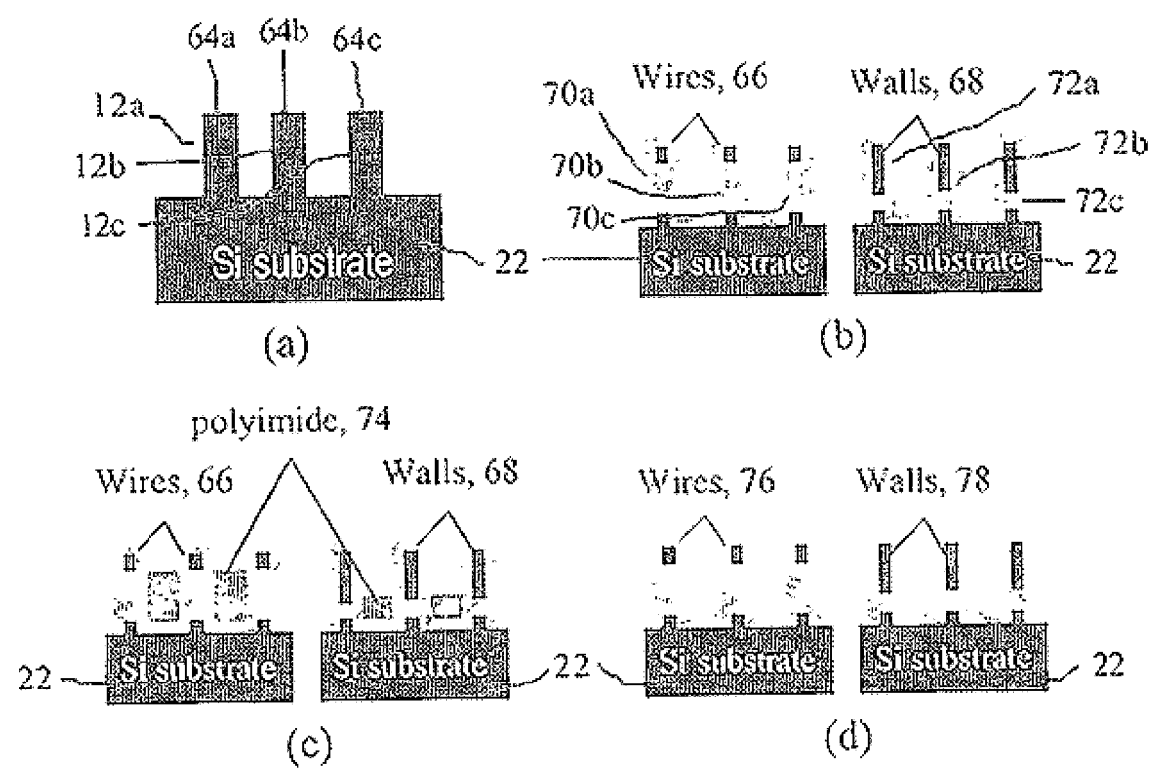
FIGS. 17a–17d show the processing sequence for a polyimide planarization and etch-back process for exposing Si wires or walls during heteroepitaxial growth, as will be explained in detail hereinbelow.

Once substrate isolation and nanoscale Si dimensions have been achieved through appropriate oxidation processes, Si walls and wires can be exposed for epilayer growth using a process sequence shown in FIG. 17 which includes the following steps: (a) FIG. 17a illustrates a desired grating structure 12a–12c having top surfaces, 64a–64c, etched into Si substrate 22; (b) FIG. 17b shows a substrate-oxide isolation process, forming surfaces, 70a–70c, for wires (etch depth <0.5 $\mu$m) or pillars, and surfaces, 72a–72c, for wall-like structures, similar to that described in FIG. 15; (c) FIG. 17c shows a polyimide film, 74, used to planarize followed by an etch-back process to expose wires or pillars, 66, or wall-like structures, 68; and (d) FIG. 17d illustrates an oxide etch process used to remove the oxide coating from the Si structures, 76, for wires or, 78, for wall-like features, followed by removal of polyimide film which was used to protect the oxide film underneath from etching.

Figure 18:
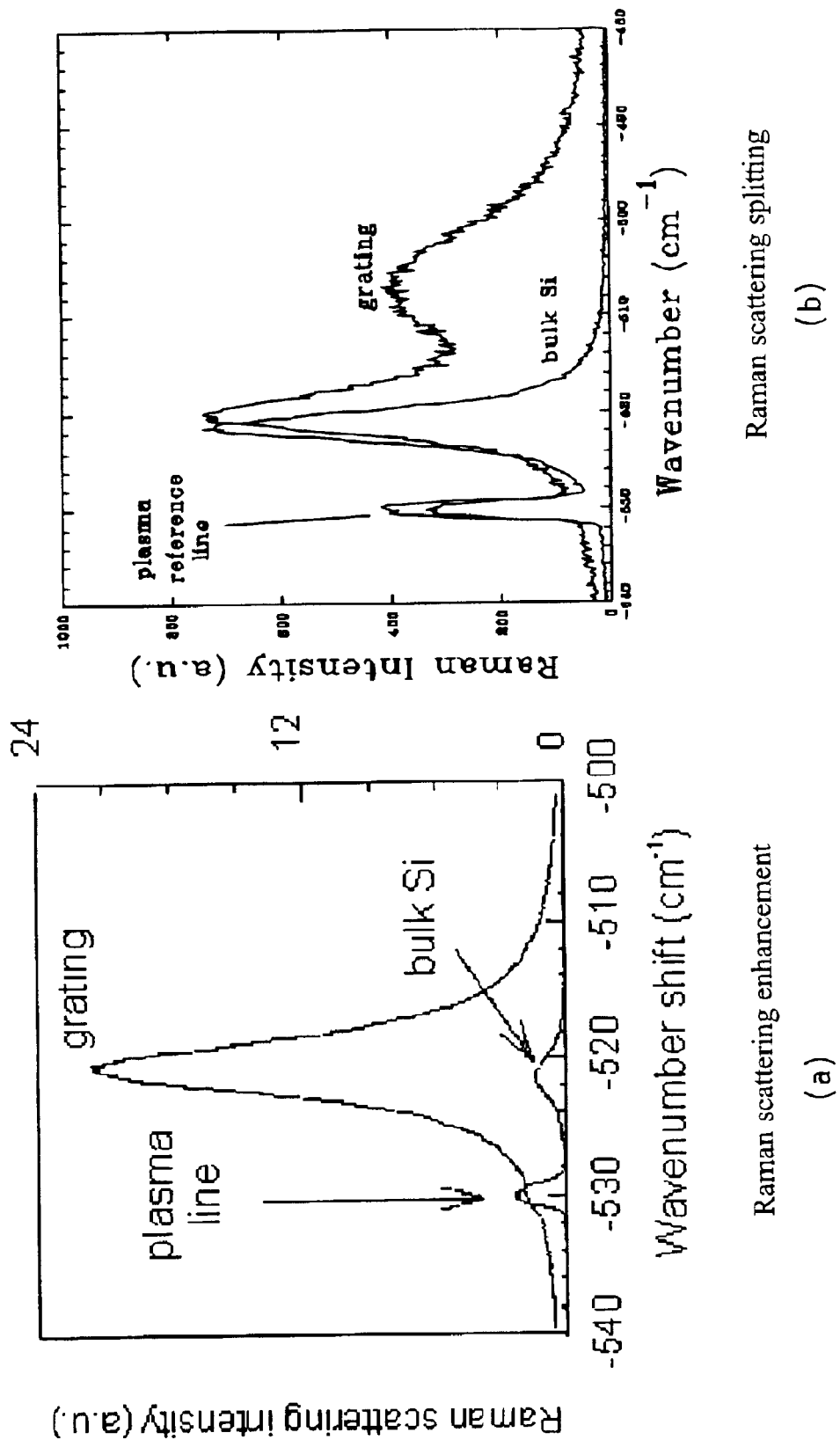
FIG. 18a is a graph of Raman scattering as a function of wavenumber for Si nanostructures having about 50 nm linewidth.
FIG. 18b is a graph of Raman scattering as a function of wavenumber for Si nanostructures having about 10-nm linewidth.

4. Optical Characterization of Silicon Linewidths:

Raman scattering (RS) measurements have been employed to optically calibrate Si linewidths (see, e.g., Saleem H. Zaidi and S. R. J. Brueck, Opt. Commun. 135, 264 (1997). RS measurements are a critical function of the linewidths. For grating linewidths >0.5 $\mu$m, RS signals are comparable, or slightly higher than those for a planar surface. As the linewidths are reduced, RS signal increases by as much as a factor of 20 relative to that for a planar surface. The RS signal maximum is a complex function of linewidth, separation, and depth. In general, a signal maximum is observed for linewidths approximately equal to 0.05 $\mu$m. As linewidths are reduced to between 0.02 $\mu$m and 0.01 $\mu$m, the RS signal no longer increases; rather, the signal line shape becomes asymmetric and shifts to lower frequencies. At linewidths of about 0.01 $\mu$m, the asymmetric line shape splits into two peaks, one corresponding to the bulk, and the other to the nanostructure. FIG. 18 shows examples of Raman scattering measurements from approximately 0.050 µm and 0.01 µm linewidth grating structures; for comparison, the RS signals from a planar surface under the same conditions are also plotted. It is to be noticed that strong enhancement occurs from the 0.05 µm-wide lines, and splitting results from the about 0.01 µm-wide Si lines.

5. Epitaxial Growth on Silicon Nanostructures

Figure 19:
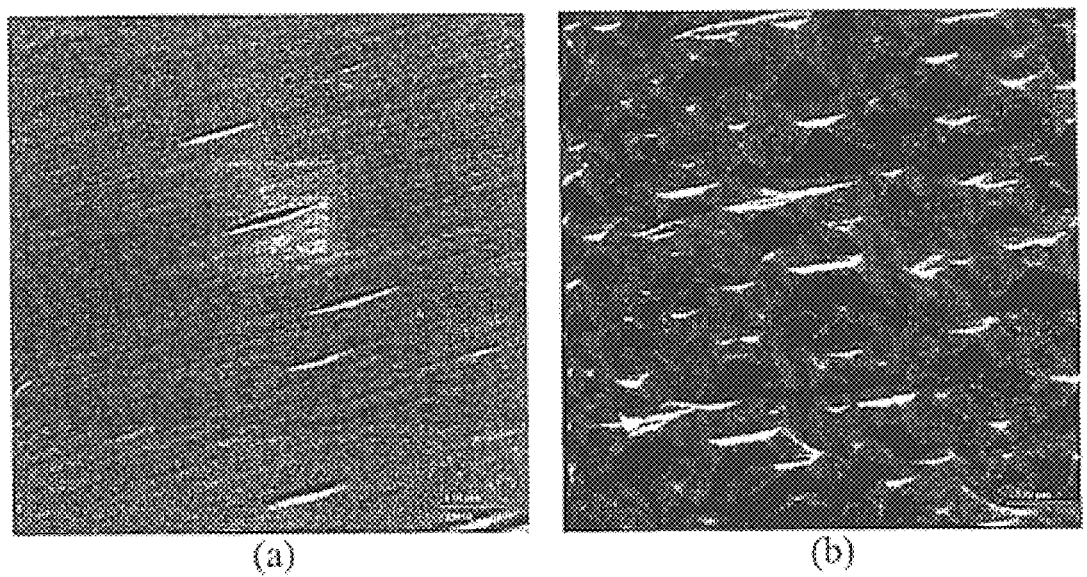
FIG. 19a is an SEM output for an approximately 5 $\mu$m-thick CVD Si growth on randomly textured columnar profiles.
FIG. 19b is an SEM output for an approximately 5 $\mu$m CVD Si growth on randomly textured triangular profiles.

Preliminary work has been performed for evaluating chemical-vapor deposition (CVD) on random and periodic Si structures. FIG. 19a shows growth of approximately 5 µm-thick CVD on columnar features where the surface appears to be smooth. FIG. 19b shows similar Si growth on triangular-profile random structures. It is seen that the growth on triangular structures follows surface contours, and has a significantly higher degree of roughness. This demonstrates that similar results may be achieved from hetero-epitaxial growths on randomly textured, nanoscale columnar Si features.

Figure 20:
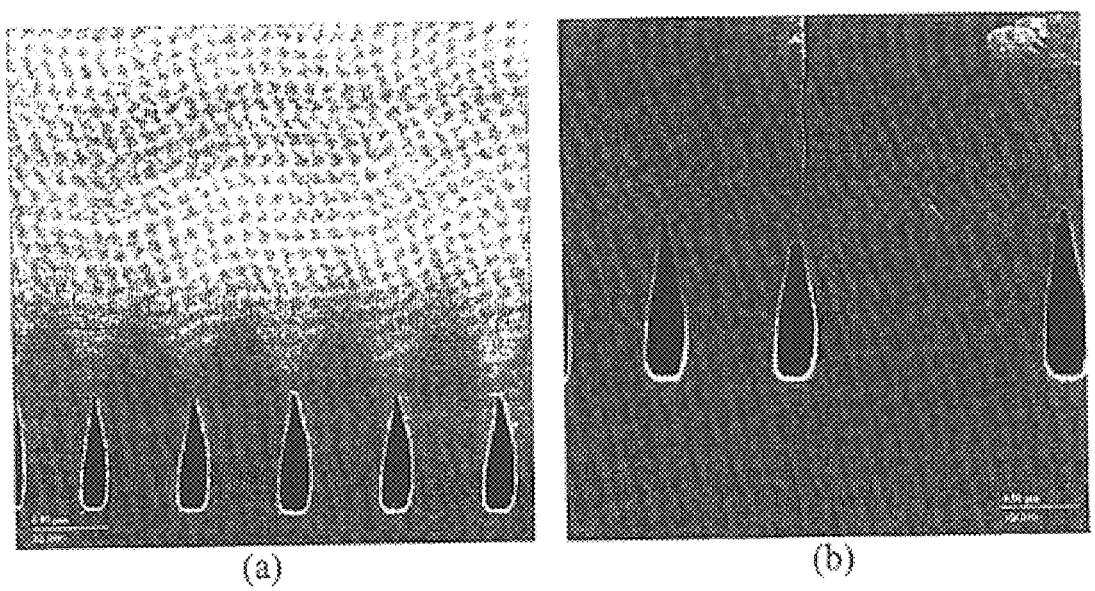
FIG. 20a is an SEM output for SiGe growth on a 1 $\mu$m-period Si grating without cracks.
FIG. 20b is an SEM output for SiGe growth on a 1 $\mu$m-period Si grating with cracks.
Figure 21:
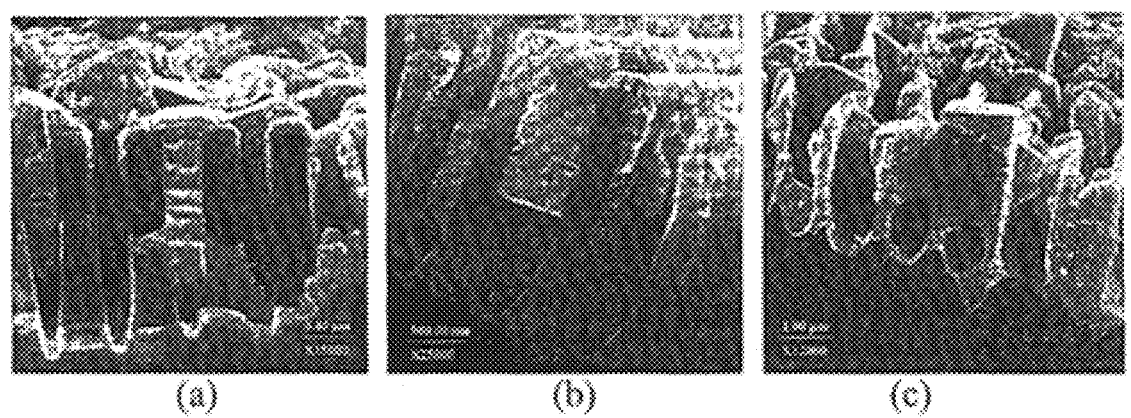
FIG. 21a is an SEM output for heteroepitaxial GaN growth on sidewalls of a 1 $\mu$m-period grating structure with a linewidth of about 0.5 $\mu$m.
FIG. 21b is an SEM output for heteroepitaxial GaN growth on sidewalls of a 1 mm-period grating structure with a linewidth of approximately 0.3 $\mu$m.
FIG. 21c is an SEM output for heteroepitaxial GaN growth on sidewalls of a 1 $\mu$m-period grating structure with a linewidth of about 0.1 $\mu$m.

Ge and GaN heteroepitaxial growth on 1-D periodic Si structures has also been investigated. FIG. 20 shows SiGe growth on 1 µm-period Si grating structures. It is to be noticed that the growth coalescence from neighboring structures leads to voids within grating lines. FIG. 20b shows presence of cracks in the epilayer due to a thermal expansion mismatch. FIG. 21 shows GaN grown on (111) Si grating structures, the sidewalls on these structures being <110> planes. FIG. 21 shows growth having 1 µm period, about 0.5 µm linewidth (FIG. 21a), 0.3 µm (FIG. 21b), and 0.1 µm (FIG. 21c). For the 0.1 µm linewidth, thermal expansion mismatch has resulted in splitting of the grating from the underlying substrate.

5. Discussion of Nanostructure Approach

In summary, etched micro- and nanoscale structures are expected to behave as compliant films during heteroepitaxial growth of any arbitrary film thickness. The proposed structures can be fabricated using well-known optical lithography, reactive ion etching, wet-chemical etching, and anodic etching techniques. The structuring approach also has the advantage of incorporating nanoporous Si and $SiO_2$ films which not only advantageously modify the thermal properties, but also enable epilayer liftoff from the underlying Si substrate. For nanoscale Si structures, Raman scattering measurements provide accurate non-contact size measurements. By applications of the structuring techniques of the present invention, epilayers can be bonded to other substrates such as glass, or plastic, and separated from the Si substrate by preferential etching of the nanoporous Si, or $SiO_2$ isolating layers, thereby permitting Si substrate reuse. Preliminary Si CVD growth results on columnar profiles show improved films in comparison with triangular profiles.

The present invention has been illustrated for Si substrates; however, periodic and random nanostructuring are expected to be applicable to other material systems such as Ge and GaAs.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for accommodating lattice and thermal expansion mismatches during heteroepitaxial growth, comprising the steps of:
   (a) forming a grating structure on the surface of a substrate;
   (b) generating a readily etchable layer physically separating the grating structure from the substrate; and
   (c) growing a heteroepitaxial layer on the grating structure, whereby lattice and thermal expansion mismatches between the substrate and the epitaxially grown compound are reduced.

2. The method as described in claim 1, wherein the substrate comprises silicon.

3. The method as described in claim 2, further comprising the step of polishing the silicon substrate on the surface upon which the grating is formed.

4. The method as described in claim 2, wherein said step of separating the grating structure from the substrate is achieved with a layer comprising nanoporous silicon.

5. The method as described in claim 4, wherein the nanoporous silicon layer is formed using anodic etching.

6. The method as described in claim 2, wherein said step of separating the grating structure from the substrate is achieved with a layer comprising silicon dioxide.

7. The method as described in claim 6, wherein the silicon dioxide layer is formed using thermal oxidation.

8. The method as described in claim 1, wherein the grating structure is 1-dimensional.

9. The method as described in claim 8, wherein the grating structure comprises a plurality of periodically spaced wall-like features disposed substantially perpendicular to the surface of the substrate.

10. The method as described in claim 9, wherein the periodically spaced wall-like features have width of between 0.01 µm and 1 µm, a depth of between 0.5 µm and 10 µm, and a spacing between 0.05 µm and 50 µm.

11. The method as described in claim 9, wherein V-like channels are formed on the periodically spaced wall-like features and supported thereby, whereby epitaxial growth is caused to occur thereon.

12. The method as described in claim 9, wherein each of the wall-like features has a planar surface having a chosen thickness formed thereon substantially perpendicular to the wall-like features, whereby the thickness of the planar surface is chosen such that epitaxial growth thereon is essentially free of defects arising from lattice and thermal expansion mismatches.

13. The method as described in claim 12, wherein each of the planar surfaces has a thickness of between 0.01 µm and 1 µm and a width of between 0.1 µm and 10 µm.

14. The method as described in claim 1, wherein the grating structure comprises a 2-dimensional, periodically spaced pattern of holes.

15. The method as described in claim 14, wherein the holes in the periodically spaced pattern of holes have diameters between 0.01 µm and 1 µm, a depth of between 0.05 µm and 10 µm and a spacing between 0.05 µm and 50 µm.

16. The method as described in claim 1, wherein the grating structure is 2-dimensional.

17. The method as described in claim 16, wherein the grating structure comprises a plurality of periodically spaced pillar-like features disposed substantially perpendicular to surface of the substrate.

18. The method as described in claim 17, wherein the periodically spaced pillar-like features have a width of between 0.01 µm and 1 µm, a depth of between 0.05 µm and 10 µm and a spacing between 0.05 µm and 50 µm.

19. The method as described in claim 17, wherein each of the pillar-like features has a planar surface with a chosen thickness formed thereon substantially perpendicular to the pillar-like features, wherein the thickness of the planar surface is chosen such that epitaxial growth thereon is essentially free of defects arising from lattice and thermal expansion mismatches.

20. The method as described in claim 19, wherein each of the planar surfaces has a thickness of between 0.01 µm and 1 µm and lateral dimensions between 0.1 µm and 10 µm.

21. The method as described in claim 17, wherein each of the pillar-like features has V-groove having a chosen thickness formed thereon, wherein the thickness of the V-groove is chosen such that epitaxial growth thereon is essentially free of defects arising from lattice and thermal expansion mismatches.

22. The method as described in claim 1, wherein said step of forming a grating structure on the surface of a substrate is achieved by a method selected from the group consisting of reactive ion etching, wet-chemical etching and anodic etching.

23. The method as described in claim 1, wherein the substrate is selected from the group consisting of germanium, gallium arsenide and other III–V semiconductor compounds.

24. The method as described in claim 1, further comprising the steps of bonding the heteroepitaxially grown layer to a second substrate, and separating the bonded heteroepitaxially grown layer from the substrate upon which it was grown by dissolving the readily etchable layer under the grating structure.

25. The method as described in claim 24, wherein the second substrate is selected from the group consisting of glass and plastic.

26. A method for accommodating lattice and thermal expansion mismatches during heteroepitaxial growth, comprising the steps of:
  (a) forming a randomly etched structure on the surface of a substrate; and
  (b) growing a heteroepitaxial layer on the grating structure, whereby lattice and thermal expansion mismatches between the substrate and the epitaxially grown compound are reduced.

27. The method as described in claim 26, wherein the randomly etched structure has features spaced-apart between 0.05 µm and 1 µm.

28. An apparatus for growing heteroepitaxial materials, comprising in combination:
  (a) a substrate having a substantially flat surface; and
  (b) a grating structure formed on the surface of said substrate, said grating structure being physically separated from said substrate by a readily etchable layer, whereby heteroepitaxial materials grown on said grating structure have reduced lattice and thermal expansion mismatches.

29. The apparatus as described in claim 28, wherein said substrate comprises silicon.

30. The apparatus as described in claim 29, wherein said silicon substrate is polished on the surface upon which said grating structure is formed.

31. The apparatus as described in claim 29, wherein said layer comprises nanoporous silicon.

32. The apparatus as described in claim 31, wherein said nanoporous silicon layer is formed using anodic etching.

33. The apparatus as described in claim 29, wherein said layer comprises silicon dioxide.

34. The apparatus as described in claim 33, wherein said silicon dioxide layer is formed using thermal oxidation.

35. The apparatus as described in claim 28, wherein the grating structure is 1-dimensional.

36. The apparatus as described in claim 35, wherein said grating structure comprises a plurality of periodically spaced, wall-like features disposed substantially perpendicular to the surface of said substrate, and wherein epitaxial growth is caused to occur thereon.

37. The apparatus as described in claim 36, wherein the periodically spaced wall-like features have a width of between 0.01 µm and 1 µm, a depth of between 0.5 µm and 10 µm, and a spacing between 0.05 µm and 50 µm.

38. The apparatus as described in claim 36, wherein V-like channels are formed on each of said periodically spaced, wall-like features and supported thereby, and wherein epitaxial growth is caused to occur thereon.

39. The apparatus as described in claim 36, wherein a planar surface having a chosen thickness and disposed substantially parallel to the surface of said substrate is formed on each of said plurality of wall-like features, wherein the thickness of said planar surface is chosen such that epitaxial growth thereon is essentially free of defects arising from lattice and thermal expansion mismatches.

40. The apparatus as described in claim 39, wherein each of said planar surfaces has a thickness of between 0.01 µm and 1 µm and a lateral dimension between 0.1 µm and 10 µm.

41. The apparatus as described in claim 28, wherein said grating structure is 2-dimensional.

42. The apparatus as described in claim 41, wherein the grating structure comprises a 2-dimensional, periodically spaced pattern of holes.

43. The apparatus as described in claim 42, wherein the holes in the periodically spaced pattern of holes have diameters between 0.01 µm and 1 µm, a depth of between 0.05 µm and 10 µm and a spacing between 0.05 µm and 50 µm.

44. The apparatus as described in claim 41, wherein said grating structure comprises a plurality of periodically spaced, pillar-like features disposed substantially perpendicular to surface of said substrate, and wherein epitaxial growth is caused to occur thereon.

45. The apparatus as described in claim 44, wherein the periodically spaced pillar-like features have a depth of between 0.05 µm and 10 µm, and a spacing between 0.05 µm and 50 µm.

46. The apparatus as described in claim 44, wherein a V-like shape is formed on each of said periodically spaced, pillar-like features and supported thereby, and wherein epitaxial growth is caused to occur thereon.

47. The apparatus as described in claim 44, wherein a planar surface having a chosen thickness and disposed substantially parallel to the surface of said substrate is formed on each of said plurality of pillar-like features, wherein the thickness of said planar surface is chosen such that epitaxial growth thereon is essentially free of defects arising from lattice and thermal expansion mismatches.

48. The apparatus as described in claim 47, wherein each of said planar surfaces has a thickness of between 0.01 µm and 1 µm and a lateral dimension between 0.1 µm and 10 µm.

49. The apparatus as described in claim 28, wherein said grating structure is formed on the surface of said substrate using a method selected from the group consisting of reactive ion etching, wet-chemical etching and anodic etching.

50. The apparatus as described in claim 28, wherein said substrate is selected from the group consisting of germanium, gallium arsenide, and other III-V semiconductor compounds.

51. An apparatus for growing heteroepitaxial materials, comprising in combination:
(a) a substrate having a substantially flat surface; and
(b) a randomly etched structure formed on the surface of said substrate, whereby heteroepitaxial materials grown on said randomly etched surface have reduced lattice and thermal expansion mismatches.

52. The apparatus as described in claim 51, wherein said substrate comprises silicon.

53. The apparatus as described in claim 51, wherein said randomly etched structure has features spaced-apart between 0.05 $\mu$m and 1 $\mu$m.

* * * * *